United States Patent
Rasmussen

(10) Patent No.: US 9,128,885 B2
(45) Date of Patent: Sep. 8, 2015

(54) COMPUTATIONALLY EFFICIENT FINITE IMPULSE RESPONSE COMB FILTERING

(71) Applicant: James L. Rasmussen, Colorado Springs, CO (US)

(72) Inventor: James L. Rasmussen, Colorado Springs, CO (US)

(73) Assignee: The MITRE Corporation, McLean, VA (US)

( * ) Notice: Subject to any disclaimer, the term of this patent is extended or adjusted under 35 U.S.C. 154(b) by 221 days.

(21) Appl. No.: 13/653,966

(22) Filed: Oct. 17, 2012

(65) Prior Publication Data

US 2014/0108479 A1    Apr. 17, 2014

(51) Int. Cl.
*H03H 17/02* (2006.01)
*G06F 17/15* (2006.01)

(52) U.S. Cl.
CPC ......... *G06F 17/156* (2013.01); *H03H 17/0213* (2013.01); *H03H 17/0251* (2013.01)

(58) Field of Classification Search
USPC .................................................. 708/300–323
See application file for complete search history.

(56) References Cited

U.S. PATENT DOCUMENTS

| | | | | |
|---|---|---|---|---|
| 5,264,922 A | * | 11/1993 | Senuma | 348/665 |
| 5,265,042 A | * | 11/1993 | Smith, Jr. | 708/310 |
| 5,479,556 A | * | 12/1995 | Oh | 388/805 |
| 5,663,771 A | * | 9/1997 | Raby | 348/663 |
| 6,434,233 B1 | | 8/2002 | Bjarnason et al. | |
| 7,693,923 B2 | | 4/2010 | Shabra et al. | |
| 2001/0055320 A1 | * | 12/2001 | Pierzga et al. | 370/480 |
| 2006/0022700 A1 | * | 2/2006 | Goel et al. | 326/8 |
| 2012/0131079 A1 | | 5/2012 | Vu | |

OTHER PUBLICATIONS

John G. Proakis and Dimitris G. Manolakis, Digital Signal Processing, 2007, Pearson Prentice Hall, pp. 341-344.*
Zahradnik, Pavel et al., "Design of Optimal Comb FIR Filters-Speed and Robustness," IEEE Signal Processing Letters, vol. 16, No. 6, Jun. 2009, pp. 465-468.
Zahradnik, Pavel et al., "Fast and Robust Analytical Design of Equiripple Comb FIR Filters for Communication Purposes," Seventh International Conference on Networking, © 2008 IEEE Computer Society, pp. 588-593.
Zahradnik, Pavel et al., "Fifth Type of Comb FIR Filters," 2011 4th International Congress on Image and Signal Processing, © 2011 IEEE, pp. 2261-2265.

* cited by examiner

*Primary Examiner* — Chuong D Ngo
*Assistant Examiner* — Calvin M Brien
(74) *Attorney, Agent, or Firm* — Sterne, Kessler, Goldstein & Fox P.L.L.C.

(57) ABSTRACT

A method and system that remove an unwanted signal and its harmonics from an input signal in a computationally efficient manner are disclosed. Embodiments include processing the FFT matrix to selectively zero-out rows of the matrix before multiplying the matrix with the Inverse FFT (IFFT) matrix. The resulting product (which is a sparse matrix) is then used to generate coefficients for a linear Finite Impulse Response (FIR) filter to process the input. The filtered output signal has the unwanted signal and its harmonics removed with minimal effect on a desired signal. The method produces a stable, physically realizable filter, requiring fewer computations than current methods.

12 Claims, 4 Drawing Sheets

COMPUTATIONALLY EFFICIENT FINITE IMPULSE RESPONSE COMB FILTERING

STATEMENT REGARDING FEDERALLY-SPONSORED RESEARCH AND DEVELOPMENT

Statement under M.P.E.P. §310. The U.S. government has a paid-up license in this invention and the right in limited circumstances to require the patent owner to license others on reasonable terms as provided for by the terms of contract W15P7T-12-C-F600 awarded by the United States Air Force.

FIELD OF THE INVENTION

Embodiments described herein generally relate to digital filtering.

BACKGROUND OF THE INVENTION

Comb filters have use in various applications. One application includes the removal of a fundamental sinusoidal signal and its harmonics from a signal of interest (SOI).

Existing comb filtering techniques have practical limitations. A first technique includes the use of a finite impulse response (FIR) filter. Although this technique is fast and simple, it typically has a poor frequency response. A second technique involves the use of an infinite impulse response (IIR) filter. Theoretically, a sharp notch filter can be created with a lower-order IIR filter than produced with an FIR filter. However, the poles of such a filter must be very close to the unit circle, which causes stability and performance problems when the filter coefficients are quantized for implementation. A third technique involves transforming a block of data samples into the frequency domain using a Fast Fourier Transform (FFT) (or, more generally, a discrete Fourier Transform), and zeroing the bins ("zero-binning") of the frequencies associated with the interference and its harmonics. An inverse transformation back to the time domain produces the filtered output data. This technique produces acceptable results, but has limited application due of its computational complexity.

SUMMARY OF THE INVENTION

Embodiments for FFT comb filtering are provided. Embodiments operate by zeroing every $M^{th}$ row of an N-point FFT matrix and multiplying the result by an IFFT matrix before operation on the input data. If N/M is an integer, multiplying the modified FFT matrix with the IFFT matrix produces a sparse matrix that can be manipulated to form a FIR filter. The input data is passed sequentially through the FIR filter, and the spectral contents of a set of uniformly spaced frequencies are nulled and removed from the data. This novel approach accomplishes the filtering without having to transform the input data into the frequency domain.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

DETAILED DESCRIPTION OF THE INVENTION

Figure 1:
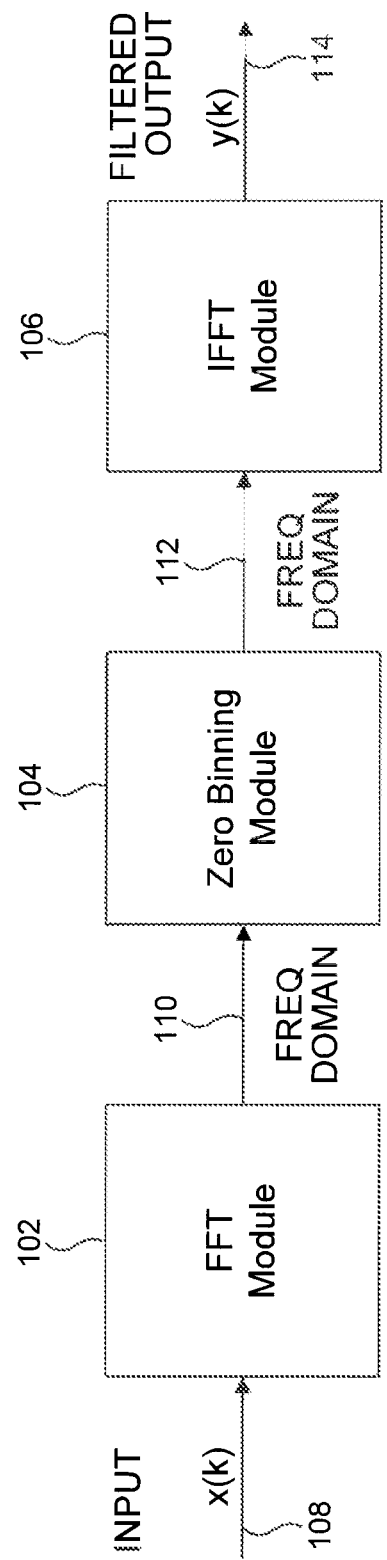
FIG. 1 is a block diagram that illustrates a FFT-based method of comb filtering.

FIG. 1 is a block diagram that illustrates a FFT-based comb filter 100. As shown in FIG. 1, comb filter 100 includes a Fast Fourier Transform (FFT) module 102, a zero-binning module 104, and an Inverse FFT (IFFT) module 106. Comb filter 100 may be used to remove an interfering continuous wave (CW) signal.

For purposes of this discussion, the term "module" shall be understood to include at least one of software, firmware, and hardware (such as one or more circuits, microchips, or devices, or any combination thereof), and any combination thereof. In addition, it will be understood that each module can include one, or more than one, component within an actual device, and each component that forms a part of the described module can function either cooperatively or independently of any other component forming a part of the module. Conversely, multiple modules described herein can represent a single component within an actual device.

Comb filtering by filter 100 begins with FFT module 102 receiving a time domain input signal 108. In an embodiment, input signal 108 includes a desired signal and an interfering CW signal. In an embodiment, input signal 108 includes an N-point block of input samples. FFT module 102 acts on input signal 108 to produce a frequency domain output signal 110.

In an embodiment, output signal 110 represents an N-point FFT of input signal 108. Generally, an N-point FFT module with a sample frequency, $f_s$, will have N frequency bins that contain frequency components spaced at intervals of:

$$f_d = \frac{f_s}{N}. \tag{1}$$

When the CW frequency and its harmonics fall exactly at integer, k, multiples of $f_d$, these frequency components, $kf_d$, will be completely contained in those bins.

Output signal 110 is fed into zero binning module 104. Zero binning module 104 acts on the bins of output signal 110 that include the interfering CW frequency and its harmonics. Specifically, zero binning module 104 zeroes the bins that include the CW frequency and its harmonics to produce signal 112. When these bins are zeroed, the interfering CW signal is eliminated.

Signal 112 is then provided to IFFT module 106. IFFT module 106 transforms signal 112 from the frequency domain to the time domain by applying an N-point IFFT to generate a filtered output signal 114.

While the conventional comb filtering technique described in FIG. 1 produces acceptable results generally, it suffers from excessive computational complexity. Specifically, the technique requires collecting N samples of data, performing an FFT on this data, zeroing every $M^{th}$ value of the resulting FFT, and then performing an inverse FFT (IFFT) to obtain the time domain filtered result. The FFT and IFFT each requires on the order of N log₂N multiplications, resulting in 2N log₂N multiplications for the entire process. As a result, practical hardware limitations (due to the size and speed of FFT manipulations that are required) eliminate this technique from usage for all but low-bandwidth applications.

Embodiments enable a comb filter that does not suffer from deficiencies of existing comb filtering techniques. Specifically, embodiments recognize that FFT comb filtering can be performed by applying an input signal through a module that implements the multiplication of the input signal with the product of an inverse FFT matrix and appropriately zeroed FFT matrix. Specifically, for an N-sample input signal, FFT comb filtering can be realized by multiplying the input signal with the product of an inverse FFT matrix and an FFT matrix, with every $M^{th}$ row of the FFT matrix set to zero, with the condition that N and M are selected such that N/M is an integer. As such, comb filtering of the input signal is realized without performing a FFT or an IFFT on the input signal.

A mathematical explanation of an embodiment is provided below for the purpose of illustration. As would be understood by a person of skill in the art, embodiments are not limited by this mathematical explanation.

Let A and $A^{-1}$ be the size N FFT and IFFT matrices. A and $A^{-1}$ may be the matrices implemented by FFT module 102 and IFFT module 106, for example. A is given by $$\frac{1}{\sqrt{N}}\begin{bmatrix} 1 & 1 & \cdots & 1 \\ 1 & W_N^1 & \cdots & W_N^{(N-1)} \\ 1 & W_N^2 & \cdots & W_N^{2(N-1)} \\ \vdots & \vdots & \vdots & \vdots \\ 1 & W_N^{(N-1)} & \cdots & W_N^{(N-1)(N-1)} \end{bmatrix}, \quad (2)$$

where $W_N = e^{-j\frac{2\pi}{N}}$.

Embodiments recognize that zeroing every $M^{th}$ value of the product of the FFT matrix with the input vector, x, is equivalent to multiplying the input vector with the FFT matrix with every $M^{th}$ row of the FFT matrix zeroed. This is further described below.

Let $A_r$ be the FFT matrix with every $M^{th}$ row zeroed. Thus, $A_r$ is given by:

$$\frac{1}{\sqrt{N}}\begin{bmatrix} 0 & 0 & \cdots & 0 \\ 1 & W_N^1 & \cdots & W_N^{(N-1)} \\ 1 & W_N^2 & \cdots & W_N^{2(N-1)} \\ \vdots & \vdots & & \vdots \\ 0 & 0 & \cdots & 0 \\ \vdots & \vdots & \vdots & \vdots \\ 1 & W_N^{(N-1)} & \cdots & W_N^{(N-1)(N-1)} \end{bmatrix}. \quad (3)$$

Let $C_r$ be the result of the multiplication of $A^{-1}$ and $A_r$:

$$C_r = A^{-1} A_r \quad (4)$$

$A_r$ can also be represented as the matrix $(A - A_e)$, where $A_e$ is the matrix $A_e$ with all its rows zeroed out except the first row and every $M^{th}$ row. Then (4) can also be expressed as:

$$C_r = A^{-1}(A - A_e) \quad (5)$$
$$= I - A^{-1}A_e.$$

Since only every $M^{th}$ element of the columns of $A_e$ is non-zero, the summation is only over 0 to (N/M−1). The elements of matrix if $A^{-1}A_e$ are sums of N/M products and can be expressed as:

$$A^{-1}A_e(ij) = \frac{1}{N}\sum_{n=0}^{\frac{N}{M}-1} W_N^{inM} W_N^{-jnM}. \quad (6)$$

This simplifies to:

$$A^{-1}A_e(ij) = \frac{1}{N}\sum_{n=0}^{\frac{N}{M}-1} W_{N/M}^{(i-j)n}. \quad (7)$$

Thus, $A^{-1}A_e$ can be written as:

$$A^{-1}A_e = \begin{cases} \frac{1}{M} & \text{for } n = \text{mod}\left(i-j, \frac{N}{M}\right) = 0 \\ 0 & \text{otherwise.} \end{cases} \quad (8)$$

Then, the $ij^{th}$ element of $C_r$ can be written as:

$$C_r(ij) = \begin{cases} 1 - \frac{1}{M} & i = j \\ -\frac{1}{M} & n = \text{mod}\left(i-j, \frac{N}{M}\right) = 0, \text{ and } i \neq j \\ 0 & \text{otherwise.} \end{cases} \quad (9)$$

Thus, $C_r$ is a multi-diagonal matrix with 2M−1 diagonals, including the main diagonal. The diagonals are spaced every N/M columns or rows apart. The main diagonal elements have the value (1−1/M) and the off-diagonal elements with non-zero elements all have the value −1/M.

Accordingly, if the input vector, x, is multiplied by the matrix $C_r$, the first value of the resulting vector can be written as:

$$\hat{x}_0 = x_0 - \frac{1}{M}\sum_{k=0}^{M-1} x_{-k\frac{N}{M}}. \quad (10)$$

In general, the $k^{th}$ value of the resulting vector can be written as:

$$\hat{x}_k = x_k - \frac{1}{M}\sum_{j=0}^{M-1} x_{k-j\frac{N}{M}}, \quad (11)$$

for k equal 0 to N/M−1.

Because of the cyclic nature of the matrix, $C_r$, only the first N/M values need to be calculated as in (11). The rest of the (N−N/M) values can be calculated using the first N/M values as:

$$\hat{x}_k = \hat{x}_{mod(k,N/M)} + x_k - x_{mod(k,N/M)}, \quad (12)$$

for k equal N/M to N−1.

As shown above, the total number of multiplications for the above described embodiment reduces to N/M, and all other operations are additions. Thus, embodiments provide an equivalent method of implementing comb filtering which is a factor of $2M\log_2/N$ more efficient than the conventional FFT method.

As a result, computation time can be reduced dramatically using embodiments. For example, for low bandwidth systems, N is typically equal to 4096 and M is typically equal to 32. With these values, the factor of improvement in computational complexity equals 768. For larger bandwidth systems, N may be $2^{19}$ or 524288. Embodiments reduce the computations by a factor of 1216 less multiplications. Further, embodiments eliminate the requirement that a radix 2 value be used for the size of the FFT. This allows greater flexibility in implementation.

There is still the requirement that all N samples must be collected before the outputs can be obtained. However, examination of (11) shows that the filtering operation is reduced to a linear FIR filter. This is highlighted in (13) as $$\hat{x}_0 = x_0 - \frac{1}{M}\sum_{j=0}^{M-1} x_{k-j\frac{N}{M}} \quad (13)$$

$$y_k = x_k - \frac{1}{M}\sum_{j=0}^{M-1} x_{k-j\frac{N}{M}}.$$

The comb filtered output can be obtained by filtering the input with the coefficients of the FIR filter in (13). While the filter operates over a wide range of N input values, only M values are involved in each output calculation. Only one multiplication and M additions are required. If M is radix 2, no multiplications, only bit shifts, are required. Once N input samples have been obtained, i.e., filter startup has completed, there is no delay in getting an output value with each new input sample.

Figure 2:
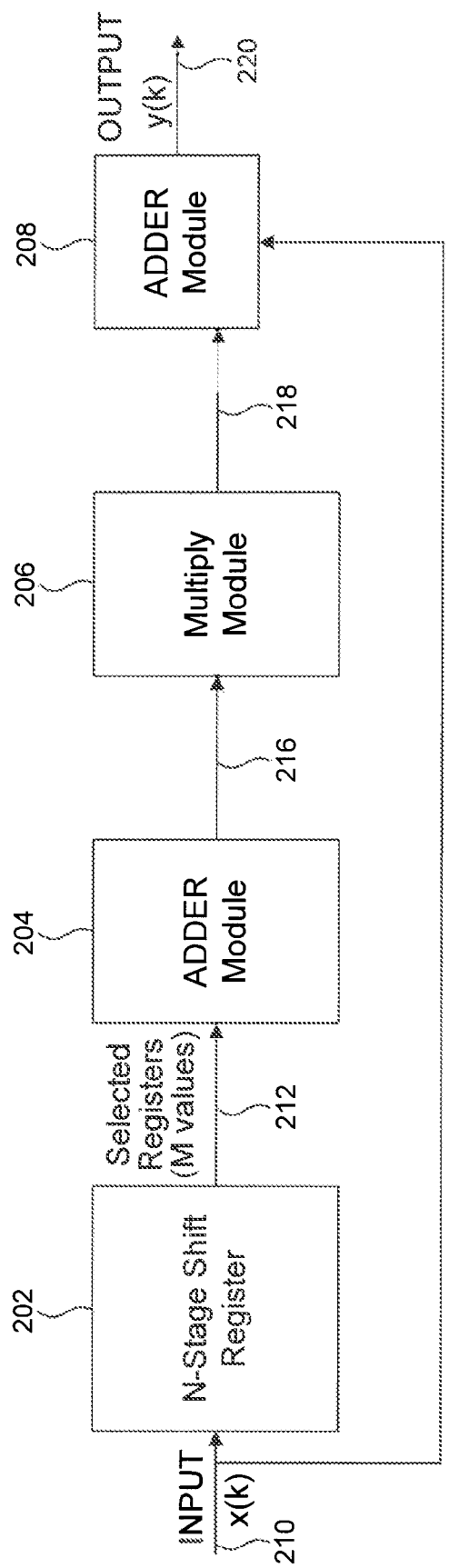
FIG. 2 is a block diagram that illustrates an example comb filter according to an embodiment.

FIG. 2 is a block diagram that illustrates an example comb filter 200 according to an embodiment. Example comb filter 200 is provided for the purpose of illustration only and is not limiting of embodiments. As shown in FIG. 2, example comb filter 200 includes a N-stage shift register 202, an adder module 204, a multiplier module 206, and an adder module 208.

N-stage shift register 202 is configured to receive an input signal 210. In an embodiment, input signal 210 includes an N-point block of input samples, which are input into N-stage shift register 202 in a serial manner. N-shift register 202 is configured to produce an output signal 212, which includes data values from select registers of N-shift register 202. In an embodiment, output signal 212 includes M values selected such that N/M is an integer.

Output signal 212 is provided to adder module 204, which is configured to add the data values contained in output signal 212 to generate a signal 216. Signal 216 is then provided to multiplier module 206, which is configured to multiply signal 216 by a scalar to produce a signal 218.

Subsequently, signal 218 is provided to adder module 208, which adds signal 218 to a current sample (time index k) of input signal 210 to generate output signal 220. Output signal 220 represents the output sample at time index k.

Figure 3:
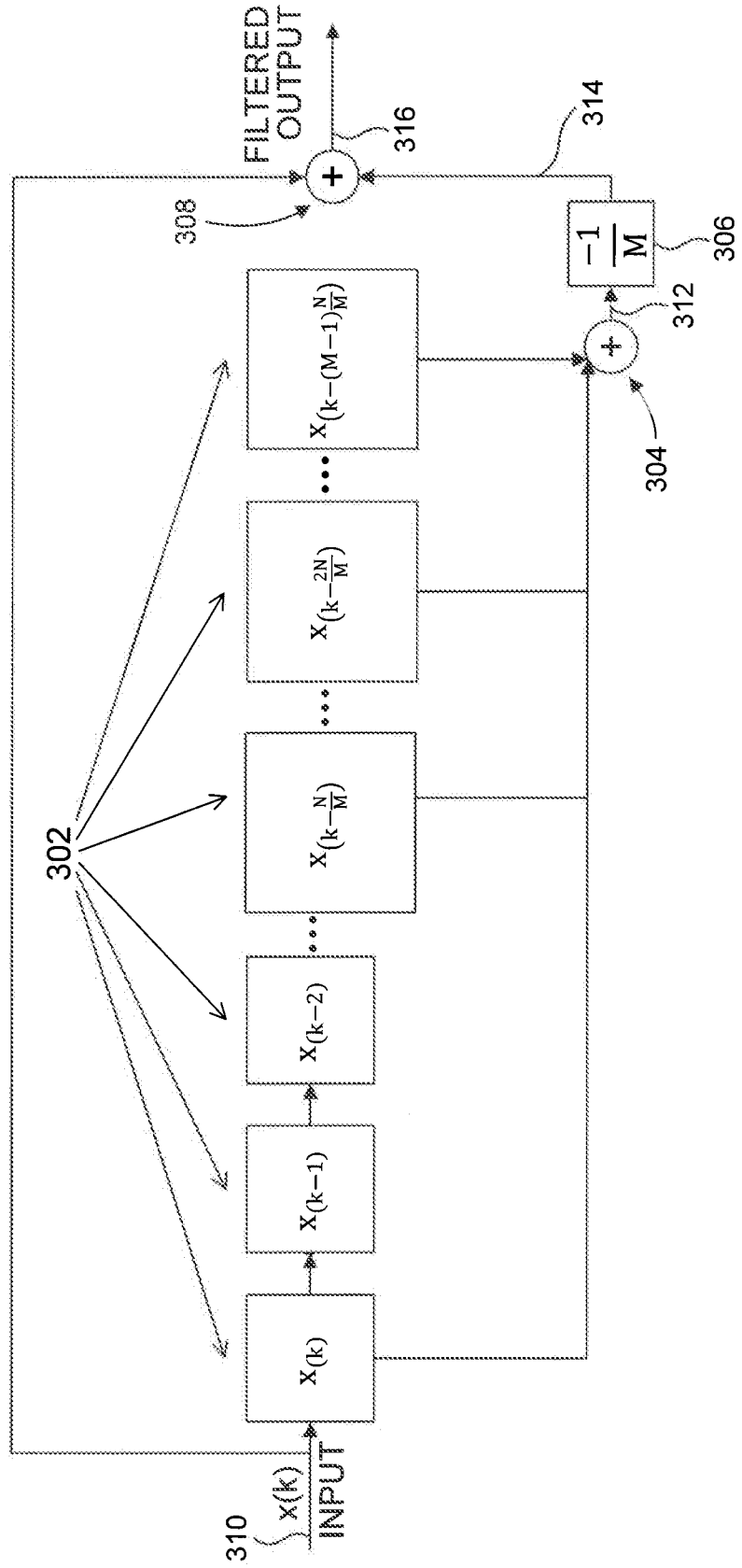
FIG. 3 is a block diagram of another example comb filter according to an embodiment.

FIG. 3 is a block diagram of another example comb filter 300 according to an embodiment. As shown in FIG. 3, example comb filter 300 includes a plurality of registers 302, an adder module 304, a multiplier module 306, and an adder module 308.

Registers 302 are configured to receive and store sequential samples of an input signal 310. In an embodiment, registers 302 includes [(M−1)N/M+1] registers, with N/M being an integer.

Adder module 304 is configured to sum values from select registers of the plurality of registers 302 to generate a signal 312. Signal 312 is multiplied by a scalar via multiplier module 306 to produce a signal 314. In an embodiment, the scalar is equal to −1/M, where M is an integer selected such that N/M is an integer.

Adder module 308 is configured to sum signal 314 and a current sample (time index k) of input signal 310 to form a current sample (time index k) of a filtered output signal 316 of comb filter 300.

Figure 4:
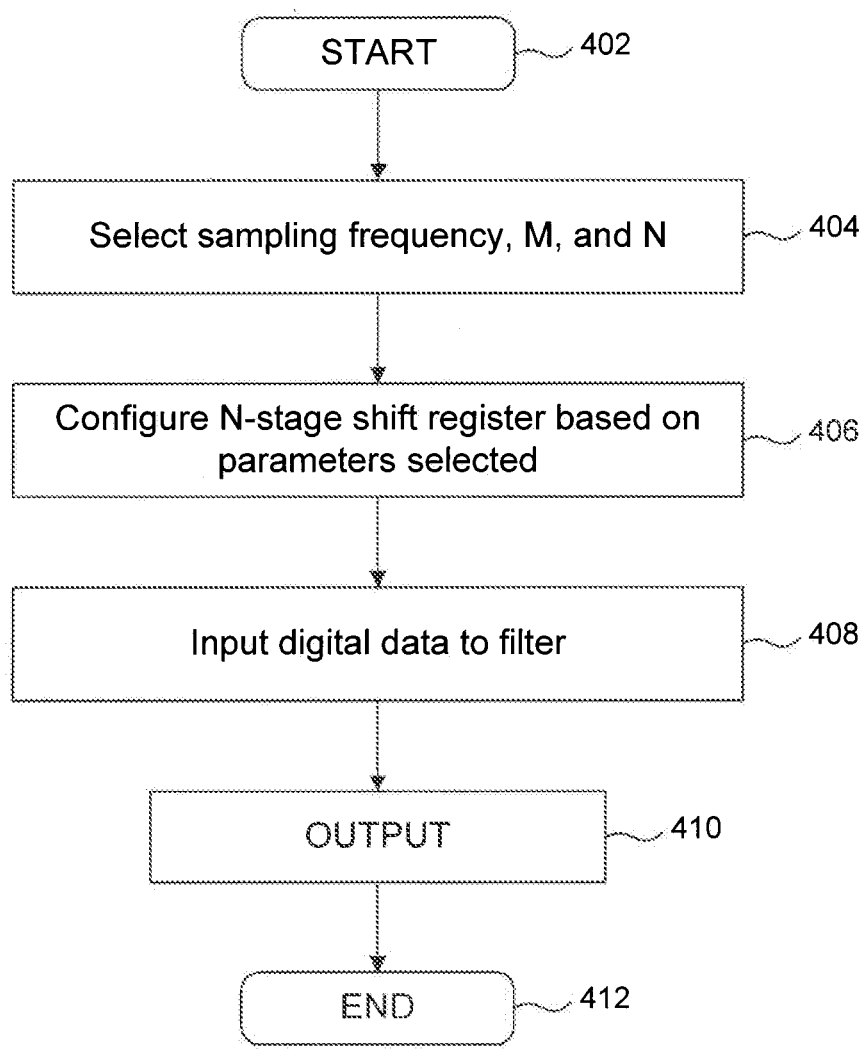
FIG. 4 is a flow chart that illustrates a comb filtering process according to an embodiment.

FIG. 4 is a flow chart that illustrates a comb filtering process 400 according to an embodiment. Process 400 is provided for the purpose of illustration and is not limiting. As shown in FIG. 4, process 400 begins at the start (402), and then proceeds to the designer's selection of three parameters, M, $f_s$, and N (404), which determine the characteristics of the filter. The factor M roughly equates to the Q factor of a conventional filter design. The choice of M (for a specific sampling frequency and number of samples) determines the width of the individual filter notches. N/M determines the number of notches. Additionally, the sampling frequency, $f_s$, and the number of points, N, that would be used for an equivalent FFT-IFFT process are selected. The shift register is then configured according to the selection of the previous parameters and the filtering equation, (13), determined by the present invention (406). Then, the input data values are input to the filter (408), and after processing are available at the output (410). The comb filtering process is completed at the end (412).

What is claimed is:

1. A method, in a hardware circuit, of calculating a digital comb filter output comprising:

receiving N samples of a receive signal comprising a desired signal, a first sinusoid and a harmonic of the first sinusoid;

computing, in a hardware adder module of the hardware circuit, a sum of every (N/M)$^{th}$ sample of the N samples and wherein N, M, and N/M are integers and the ratio N/M is greater than 1;

scaling, in a hardware multiplier module of the hardware circuit, the sum by 1/M to form a scaled sum; and outputting the digital comb filter output as a difference between a current sample of the receive signal and the scaled sum, wherein the digital comb filter output is an estimate of the desired signal.

2. The method of claim 1, wherein N/M is greater than 2.

3. The method of claim 1, wherein N is 524288.

4. The method of claim 1, wherein M is 32.

5. The method of claim 1, wherein N is not radix 2.

6. The method of claim 1, wherein M is not radix 2.

7. A hardware circuit for calculating a digital comb filter output, the hardware circuit comprising:

a sequence of registers configured to receive N consecutive samples of a receive signal comprising a desired signal, a first sinusoid and a harmonic of the first sinusoid, wherein N, M, and N/M are integers and the ratio N/M is greater than 1;

a first hardware adder module coupled to every $(N/M)^{th}$ register of the sequence of registers and configured to compute a sum of every $(N/M)^{th}$ register;

a hardware multiplier module coupled to the first hardware adder module and configured to scale an output of the first hardware adder module by 1/M to form a scaled sum; and a second hardware adder module coupled to the first hardware adder module and to an input of the sequence of registers, wherein the second hardware adder module is configured to output the digital comb filter output as a difference between a current sample of the receive signal and the scaled sum and wherein the digital comb filter output is an estimate of the desired signal.

8. The hardware circuit of claim 7, wherein N/M is greater than 2.

9. The hardware circuit of claim 7, wherein N is 524288.

10. The hardware circuit of claim 7, wherein M is 32.

11. The hardware circuit of claim 7, wherein N is not radix 2.

12. The hardware circuit of claim 7, wherein M is not radix 2.

* * * * *